United States Patent
Roh et al.

(10) Patent No.: US 8,828,266 B2
(45) Date of Patent: Sep. 9, 2014

(54) CMP SLURRY COMPOSITION AND POLISHING METHOD USING THE SAME

(71) Applicant: Cheil Industries Inc., Gumi-si (KR)

(72) Inventors: Hyun Soo Roh, Uiwang-si (KR); Dong Jin Kim, Uiwang-si (KR); Yong Soon Park, Uiwang-si (KR); Yong Kuk Kim, Uiwang-si (KR); Young Chul Jung, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/720,010

(22) Filed: Dec. 19, 2012

(65) Prior Publication Data

US 2013/0171823 A1    Jul. 4, 2013

(30) Foreign Application Priority Data

Dec. 30, 2011 (KR) .......................... 10-2011-0147630

(51) Int. Cl.
 *C09K 13/00* (2006.01)
 *C09G 1/02* (2006.01)
 *H01L 21/306* (2006.01)
 *H01L 21/3105* (2006.01)
 *C09K 3/14* (2006.01)

(52) U.S. Cl.
 CPC ............ *C09G 1/02* (2013.01); *H01L 21/30625* (2013.01); *H01L 21/31053* (2013.01); *C09K 3/1463* (2013.01)
 USPC ............................ 252/79.1; 438/693; 216/89

(58) Field of Classification Search
 CPC .......... C09G 1/02; C09G 1/00; C09K 3/1463; H01L 21/3212
 USPC ............... 216/89, 88; 438/693, 692; 252/79.1
 See application file for complete search history.

(56) References Cited

U.S. PATENT DOCUMENTS 6,139,763 A * 10/2000 Ina et al. .......................... 216/89
7,303,993 B2 * 12/2007 Kelley et al. .................. 438/692

* cited by examiner

*Primary Examiner* — Roberts Culbert
(74) *Attorney, Agent, or Firm* — Additon, Higgins & Pendleton, P.A.

(57) ABSTRACT

A CMP slurry composition includes metal oxide particles, a diisocyanate compound, and deionized water. The CMP slurry composition is capable of selectively controlling polishing speed of a wafer surface having a convex portion and a concave portion, such that primary polishing and secondary polishing can be performed rapidly while stopping polishing of the nitride layer upon the secondary polishing.

26 Claims, No Drawings

CMP SLURRY COMPOSITION AND POLISHING METHOD USING THE SAME

CROSS-REFERENCE TO RELATED APPLICATIONS

This application claims priority under 35 USC Section 119 to and the benefit of Korean Patent Application No. 10-2011-0147630 filed on Dec. 30, 2011, the entire disclosure of which is incorporated herein by reference.

FIELD OF THE INVENTION

The present invention relates to a chemical mechanical polishing (CMP) slurry composition and a polishing method using the same.

BACKGROUND OF THE INVENTION

With the recent development of micro-machining technology for ultra-large scale integrated circuits (ULSI), a design rule of 20 nm is realized. CMP has been spotlighted as an important process for planarization of a photoresist layer, leading to improved precision of patterns formed after exposure of the planarized surface and thus increasing manufacturing yield of semiconductor devices. In particular, since shallow trench isolation (STI) is the first process in semiconductor processing to which the most precise design is applied, planarization after STI is a core process in device fabrication.

CMP slurries comprising ceria particles have attracted attention as a major material for controlling selectivity of a polishing speed between silicon nitride ($Si_3N_4$) deposited to a thickness of about 300 to about 500 Å as an STI pattern mask in GATE formation sites and silicon oxide ($SiO_2$) layer deposited on a trench isolation region and silicon nitride.

In STI, oxides filling trenches for isolation of devices after deposition of a nitride layer mask at device formation sites may be over-deposited by up to 7,000 Å on the nitride layer so as to ensure complete filling.

At this point, a step of 2,000 Å to 3,000 Å may be formed between the oxide layer deposited on the nitride layer and the oxide layer deposited in a trench of about 2,000 to about 2,500 Å. Accordingly, STI CMP consists of three steps, i.e., primary polishing for removing the step between over-deposited oxide layer (convex portion) on the nitride layer and the oxide layer (concave portion) on the trench, secondary polishing for removing the oxide on the nitride layer, and tertiary polishing for over-polishing in order to completely remove remaining oxide on the nitride layer.

In primary polishing, the oxide step is rapidly removed to provide good productivity. In secondary polishing, a planarized surface is formed by polishing the oxide layer to a thickness of about 500 to about 1000 Å on the nitride layer in order to prevent the oxide layer in the trench from being polished, instead of the nitride layer, to the height or less of the nitride layer. In tertiary polishing, the nitride layer is subjected to over-polishing to a thickness of 100 Å or less in order to completely remove the oxide layer on the nitride layer while minimizing loss (dishing) of the oxide layer in trench.

Ceria abrasives have strong reactivity with an oxide layer and thus, at a low concentration of about 1% or less, the ceria abrasives may exert a polishing speed that is about two times faster than silica abrasives requiring a concentration of about 10% or more. Recently, ceria abrasives have been developed so as to prevent CMP defects by reducing a particle diameter to about 100 nm.

Therefore, there is an urgent need for a CMP slurry composition capable of maintaining a polishing speed of about 2000 Å/minute or more when polishing an oxide layer deposited on a nitride layer while maintaining a ratio of the polishing speed of the oxide layer on the trench to the polishing speed of the nitride layer at about 50 or more, while keeping surface defects of the overall layer below 70 nm in size upon polishing.

SUMMARY OF THE INVENTION

Embodiments of the present invention provide a CMP slurry composition capable of maintaining a polishing speed of about 2000 Å/minute or more when polishing an oxide layer deposited on a nitride layer while maintaining a ratio of the polishing speed of the oxide layer on the trench to the polishing speed of the nitride layer at about 50 or more, while keeping surface defects of the overall layer below 70 nm in size upon polishing.

The CMP slurry composition includes metal oxide particles, a diisocyanate compound, and deionized water.

The metal oxide particles may be prepared by calcination, flame oxidation, or thermal synthesis.

The metal oxide particles may include ceria ($CeO_2$) particles, silica ($SiO_2$) particles, alumina ($Al_2O_3$) particles, titania ($TiO_2$) particles, zirconia ($ZrO_2$) particles, and the like, and combinations thereof.

The metal oxide particles may have an average particle diameter of about 70 nm to about 150 nm, and a specific surface area of about 10 $m^2/g$ to about 50 $m^2/g$.

The metal oxide particles may have a positive zeta potential.

The metal oxide particles may comprise ceria particles.

The diisocyanate compound may have a structure that contains a hydrophilic group at a terminal of a hydrophobic diisocyanate repeating moiety.

In one embodiment, the diisocyanate compound may be represented by Formula 1:

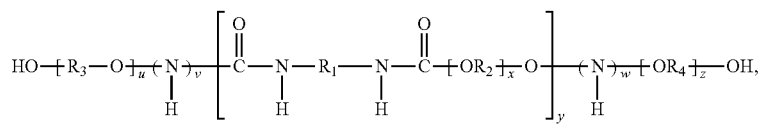

[Formula 1]

wherein $R_1$ is substituted or unsubstituted $C_3$ to $C_{20}$ cycloalkylene or substituted or unsubstituted $C_6$ to $C_{20}$ arylene; $R_2$, $R_3$ and $R_4$ are the same or different and are each independently linear or branched $C_2$ to $C_4$ alkylene; x is 1 to 5; y is 1 to 20; v and w are the same or different and are each independently 0 to 1; and u and z are the same or different and are each independently 0 to 1500.

The diisocyanate compound may have a weight average molecular weight of about 100 g/mol to about 100,000 g/mol.

The CMP slurry composition may further include an amphoteric ion compound. In one embodiment, the amphoteric ion compound may include at least one amino acid. Examples of the amino acid include without limitation alanine, phenylalanine, proline, glycine, histidine, lysine, arginine, threonine, aspartic acid, tryptophan, glutamine, betaine, cocamidopropyl betaine, lauryl propyl betaine, and the like, and combinations thereof.

The CMP slurry composition may include the amphoteric ion compound in an amount of about 0.001 wt % to about 1 wt %, based on the total weight of the CMP slurry composition.

In one embodiment, the CMP slurry composition may include about 0.01 wt % to about 1 wt % of the metal oxide particles, about 0.001 wt % to 2 wt % of the diisocyanate compound, and the balance of deionized water.

In one embodiment, the CMP slurry composition may have a polishing speed of about 2000 Å/minute or more when polishing an oxide layer on a nitride layer, and a selection ratio of about 50 or more as calculated by Equation 1:

$$\text{Selection ratio} = \beta/\alpha \quad \text{[Equation 1]}$$

wherein $\alpha$ is a polishing speed for a nitride layer and $\beta$ is a polishing speed for an oxide layer on a trench.

The present invention also provides a polishing method using the CMP slurry composition. In one embodiment, the method includes: polishing a semiconductor wafer using the CMP slurry composition.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

A CMP slurry composition according to the present invention includes metal oxide particles, a diisocyanate compound, and deionized water.

Metal Oxide Particles

The CMP slurry composition includes metal oxide particles.

The metal oxide particles may be prepared by calcination, flame oxidation, or thermal synthesis.

Examples of the metal oxide particles may include without limitation ceria ($CeO_2$) particles, silica ($SiO_2$) particles, alumina ($Al_2O_3$) particles, titania ($TiO_2$) particles, zirconia ($ZrO_2$) particles, and the like, and combinations thereof.

The metal oxide particles may have an average particle diameter of about 70 nm to about 150 nm and a specific surface area of about 10 $m^2$/g to about 50 $m^2$/g so as to obtain a desired polishing speed for an oxide layer while suppressing polishing of a nitride layer.

The metal oxide particles may have a positive zeta potential or a negative zeta potential. In terms of polishing speed for the oxide layer, in exemplary embodiments, the metal oxide particles can have a positive zeta potential.

The metal oxide particles may comprise ceria particles.

When using ceria particles prepared by thermal synthesis and having a positive zeta potential as the metal oxide particles, there is no need for a dispersant. In this embodiment, the inherent positive zeta potential of the metal oxide particles may be maintained without any change in zeta potential due to the dispersant, which can provide considerable benefits in polishing of the oxide layer.

The CMP slurry composition can include the metal oxide particles in an amount of about 0.01 wt % to about 1 wt %, for example about 0.1 wt % to about 0.7 wt %, based on the total weight of the CMP slurry composition. In some embodiments, the CMP slurry composition can include the metal oxide particles in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, or 1 wt %. Further, according to some embodiments of the present invention, the amount of metal oxide particles can be in a range from about any of the foregoing amounts to about any other of the foregoing amounts.

Diisocyanate Compound

The CMP slurry composition includes a diisocyanate compound. The diisocyanate compound may improve polishing profiles by controlling the polishing speed for the oxide layer over-deposited on the nitride layer, may suppress polishing of the nitride layer, may minimize dishing of the oxide layer on the trench, and may keep surface defects of the overall layer below 70 nm in size upon polishing.

The diisocyanate compound may include a structure containing a hydrophilic group at the terminal of a diisocyanate repeating moiety. For example, the diisocyanate compound may include a hydroxyl group at the terminal thereof. The diisocyanate compound may be a water soluble compound. In exemplary embodiments, the diisocyanate compound is cyclic diisocyanate.

In one embodiment, the diisocyanate compound may be represented by Formula 1:

[Formula 1]

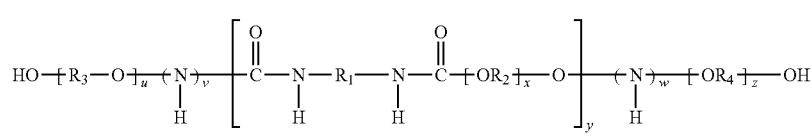

wherein $R_1$ is substituted or unsubstituted $C_3$ to $C_{20}$ cycloalkylene or substituted or unsubstituted $C_6$ to $C_{20}$ arylene; $R_2$, $R_3$ and $R_4$ are the same or different and are each independently linear or branched $C_2$ to $C_4$ alkylene; x is 1 to 5; y is 1 to 20; v and w are the same or different and are each independently 0 to 1; and u and z are the same or different and are each independently 0 to 1500.

As used herein, unless otherwise defined, the term "substituted" means that a hydrogen atom of a compound is substituted by a halogen atom, such as F, Cl, Br, and I, a hydroxyl group, a nitro group, a cyano group, an amino group, an azido group, an amidino group, a hydrazino group, a hydrazono group, a carbonyl group, a carbamyl group, a thiol group, an ester group, a carboxyl group or salt thereof, a sulfonic acid group or salt thereof, a phosphate group or salt thereof, a C1 to C20 alkyl group, a C2 to C20 alkenyl group, a C2 to C20 alkynyl group, a C1 to C20 alkoxy group, a C6 to C30 aryl group, a C6 to C30 aryloxy group, a C3 to C30 cycloalkyl group, a C3 to C30 cycloalkenyl group, a C3 to C30 cycloalkynyl group, or a combination thereof.

The diisocyanate compound may have a weight average molecular weight ranging from about 100 g/mol to about 100,000 g/mol, and a viscosity ranging from about 0.9 cP to about 5 cP.

The CMP slurry composition may include the diisocyanate compound in an amount of about 0.001 wt % to 2 wt %, for example about 0.005 wt % to about 1.5 wt %, and as another example about 0.01 wt % to about 1 wt %, based on the total weight of the CMP slurry composition. In some embodiments, the CMP slurry composition may include the diisocyanate compound in an amount of about 0.001, 0.002, 0.003, 0.004, 0.005, 0.006, 0.007, 0.008, 0.009, 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1.0, 1.1, 1.2, 1.3, 1.4, 1.5, 1.6, 1.7, 1.8, 1.9, or 2.0 wt %. Further, according to some embodiments of the present invention, the amount of the diisocyanate compound can be in a range from about any of the foregoing amounts to about any other of the foregoing amounts.

Including the diisocyanate compound in an amount within the above range may improve polishing profiles by controlling the polishing speed for the oxide layer over-deposited on the nitride layer, may suppress polishing of the nitride layer, may minimize dishing of the oxide layer on the trench, and may keep surface defects of the overall layer below 70 nm in size upon polishing.

Amphoteric Ion Compound

The CMP slurry composition may further include an amphoteric ion compound in order to stop polishing of the nitride layer.

Examples of the amphoteric ion compound include amino acids, such as but not limited to alanine, phenylalanine, proline, glycine, histidine, lysine, arginine, threonine, aspartic acid, tryptophan, glutamine, betaine, cocamidopropyl betaine, lauryl propyl betaine, and the like. These may be used alone or in combination of two or more thereof.

The CMP slurry composition may include the amphoteric ion compound in an amount of about 0.001 wt % to about 1 wt %, for example about 0.005 wt % to about 0.7 wt %, and as another example about 0.01 wt % to about 0.4 wt %, based on the total weight of the CMP slurry composition. In some embodiments, the CMP slurry composition may include the amphoteric ion compound in an amount of about 0.001, 0.002, 0.003, 0.004, 0.005, 0.006, 0.007, 0.008, 0.009, 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, or 1 wt %. Further, according to some embodiments of the present invention, the amount of the amphoteric ion compound can be in a range from about any of the foregoing amounts to about any other of the foregoing amounts.

Including the amphoteric ion compound in an amount within the above range may ensure the polishing speed for the oxide layer deposited on the nitride layer, may greatly suppress polishing of the nitride layer, and may keep surface defects of the overall layer below 70 nm in size upon polishing.

In one embodiment, the CMP slurry composition may have a polishing speed of 2000 Å/min or more, for example, in the range of about 2100 Å/min to about 5500 Å/min, when polishing the oxide layer deposited on the nitride layer. Further, the CMP slurry composition has a selection ratio of about 50 or more, as calculated by Equation 1:

$$\text{Selection ratio} = \beta/\alpha \quad \text{[Equation 1]}$$

wherein $\alpha$ is a polishing speed for a nitride layer and $\beta$ is a polishing speed for an oxide layer on a trench.

A polishing method according to the present invention includes polishing a semiconductor wafer using the CMP slurry composition. The method may be an interlayer dielectric (ILD) process or a shallow trench isolation (STI) process. Since the CMP slurry composition according to the present invention can provide excellent polishing efficiency for a patterned oxide layer, the semiconductor wafer to be polished may include a patterned oxide layer.

Next, the constitution and functions of the present invention will be explained in more detail with reference to the following preferred examples. These examples are provided for illustration only and are not to be construed in any way as limiting the present invention.

Descriptions of details apparent to those skilled in the art will be omitted herein.

EXAMPLES

Details of components used in examples and comparative examples are as follows.

(A) Metal oxide particle (a1) Ceria having a zeta potential of 40 mV with an average particle diameter of 110 nm and a specific surface area of 30 m$^2$/g.

(B) Diisocyanate compound or polymer (b1) Diisocyanate compound represented by Formula 1-1:

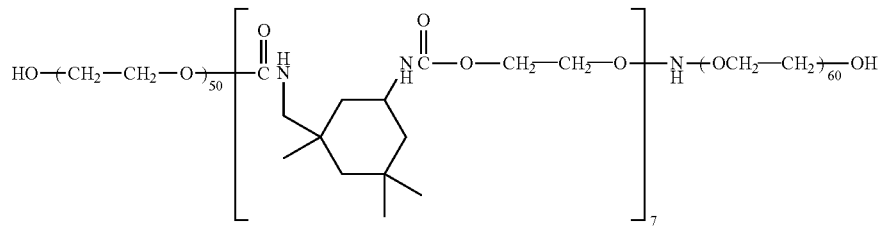

(b2) Diisocyanate compound represented by Formula 1-2:

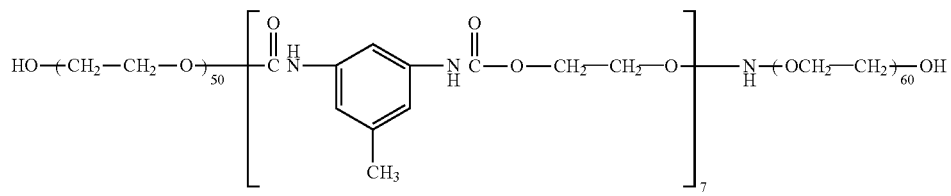

(b3) Amphoteric surfactant having a weight average molecular weight of 10,000 g/mol represented by Formula 2:

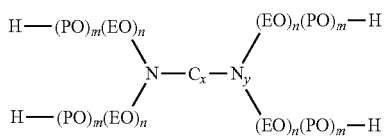

wherein Cx is ethylene, y=1, m=0, EO is ethylene oxide, and PO is propylene oxide.

(b4) Polyethylene oxide having a weight average molecular weight of 50,000 g/mol (C) Amphoteric ion compound
(c1) Aspartic acid
(c2) Glycine
(c3) Histidine Examples 1 to 6 and Comparative Examples 1 to 5

Each component mentioned above is mixed in an amount as listed in Table 1 with deionized water to prepare samples. The samples are adjusted to pH 4.5 to obtain CMP slurry compositions. Polishing performance is evaluated as to a patterned wafer having a pattern density of 50% and a pitch size of 100 μm under the following polishing conditions. Results are summarized in Table 2. Polishing speed is calculated by measuring change in thickness of a wafer removed by polishing using Optiprobe2600 (available from Thermal-Wave Company).

<Conditions for Polishing>
Wafer for measuring polishing speed: 200 mm MIT (Massachusetts Institute of Technology) patterned wafer
Wafer for measuring surface defect: 200 mm TEOS-blanket
Polishing equipment: AMAT Mirra (AMAT Company)
Polishing pad: IC1010 k-groove (Rodel Company)
Polishing time: P1: 60 seconds, P2: 30 seconds, and P3: 40 seconds
Pressure: 3 psi
Platen rpm: 103 rpm
Head rpm: 97 rpm
Flow rate: 200 ml/min
Post Cleaning:
  1st, double side scrubbing under DHF, 60 seconds
  2nd, double side scrubbing under DHF, 30 seconds
  Final, spin drying

TABLE 1

| Unit: wt % | | Example 1 | 2 | 3 | 4 | 5 | 6 | Comparative Example 1 | 2 | 3 | 4 | 5 |
|---|---|---|---|---|---|---|---|---|---|---|---|---|
| (A) | (a1) | 0.5 | 0.5 | 0.5 | 0.5 | 0.5 | 0.5 | 0.5 | 0.5 | 0.5 | 0.5 | 0.5 |
| (B) | (b1) | 0.8 | 0.4 | 0.4 | 0.4 | — | — | — | — | — | — | — |
| | (b2) | — | — | — | — | 0.4 | 0.4 | — | — | — | — | — |
| | (b3) | — | — | — | — | — | — | 0.5 | — | — | — | — |
| | (b4) | — | — | — | — | — | — | — | 0.3 | — | — | — |
| (C) | (c1) | — | 0.2 | — | — | 0.2 | 0.2 | 0.2 | — | 0.2 | — | — |
| | (c2) | — | — | 0.2 | — | — | — | — | — | — | 0.2 | — |
| | (c3) | — | — | — | 0.2 | — | — | — | — | — | — | 0.2 |

TABLE 2

| | Convex portion Ox RR | Convex portion SiN RR (α) | Concave portion Ox RR (β) | Selection ratio (β/α) | Surface defect (number) |
|---|---|---|---|---|---|
| Comparative Example 1 | 3400 | 20 | 720 | 36 | 530 |
| Comparative Example 2 | 3500 | 62 | 1500 | 24 | 350 |
| Comparative Example 3 | 4300 | 260 | 1820 | 7 | 625 |
| Comparative Example 4 | 5230 | 650 | 2300 | 4 | 450 |
| Comparative Example 5 | 4800 | 320 | 950 | 3 | 385 |
| Example 1 | 2150 | 3 | 170 | 57 | 361 |
| Example 2 | 3500 | 5 | 270 | 54 | 205 |
| Example 3 | 2900 | 9 | 450 | 50 | 265 |
| Example 4 | 3400 | 3 | 240 | 80 | 195 |
| Example 5 | 3600 | 6 | 370 | 62 | 176 |
| Example 6 | 3600 | 7 | 350 | 50 | 182 |

NOTE:
Polishing speed unit: Å/min
Surface defect: After post-cleaning the wafer, surface defect of 70 nm or more is measured using a surface defect detector (LS6800, available from Hitachi Ltd.)
Convex portion Ox RR refers to a polishing speed for an oxide layer on a nitride layer; convex portion SiN RR refers to a polishing speed for a nitride layer; and concave portion Ox RR refers to a polishing speed for an oxide layer on a trench.
Selection ratio is calculated according to Equation 1:
[Equation 1]
Selection ratio = β/α wherein α is a polishing speed for a nitride layer and β is a polishing speed for an oxide layer on a trench.

As shown in Table 2, Examples 1 to 6 exhibit higher selection ratio and significantly reduced surface defect as compared with Comparative Examples 1 to 5.

As can be seen from the above, the present invention can provide a CMP slurry composition capable of maintaining a polishing speed of about 2000 Å/minute or more when polishing an oxide layer deposited on a nitride layer while maintaining a ratio of a polishing speed of an oxide layer on a trench to a polishing speed of the nitride layer at about 50 or more, while keeping surface defects of the overall layer below 70 nm in size upon polishing.

Many modifications and other embodiments of the invention will come to mind to one skilled in the art to which this invention pertains having the benefit of the teachings presented in the foregoing description. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A CMP slurry composition comprising: metal oxide particles; a diisocyanate compound; and deionized water, wherein the diisocyanate compound has a structure that contains a hydrophilic group at a terminal of a hydrophobic diisocyanate repeating moiety.

2. The CMP slurry composition according to claim 1, wherein the metal oxide particles are prepared by calcination, flame oxidation, or thermal synthesis.

3. The CMP slurry composition according to claim 1, wherein the metal oxide particles comprise ceria ($CeO_2$) particles, silica ($SiO_2$) particles, alumina ($Al_2O_3$) particles, titania ($TiO_2$) particles, zirconia ($ZrO_2$) particles, or a combination thereof.

4. The CMP slurry composition according to claim 1, wherein the metal oxide particles have an average particle diameter of about 70 nm to about 150 nm and a specific surface area of about 10 $m^2/g$ to about 50 $m^2/g$.

5. The CMP slurry composition according to claim 1, wherein the metal oxide particles have a positive zeta potential.

6. The CMP slurry composition according to claim 1, wherein the metal oxide particles comprise ceria particles.

7. A CMP slurry composition comprising: metal oxide particles; a diisocyanate compound; and deionized water, wherein the diisocyanate compound is represented by Formula 1:

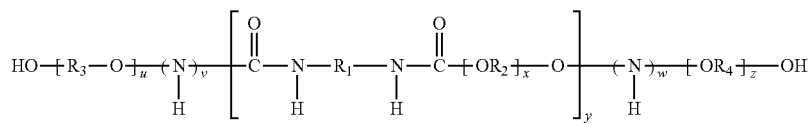

[Formula 1]

wherein $R_1$ is substituted or unsubstituted $C_3$ to $C_{20}$ cycloalkylene or substituted or unsubstituted $C_6$ to $C_{20}$ arylene; $R_2$, $R_3$ and $R_4$ are the same or different and are each independently linear or branched $C_2$ to $C_4$ alkylene; x is 1 to 5; y is 1 to 20; v and w are the same or different and are each independently 0 to 1; and u and z are the same or different and are each independently 0 to 1500.

8. The CMP slurry composition according to claim 1, wherein the diisocyanate compound has a weight average molecular weight of about 100 g/mol to about 100,000 g/mol.

9. The CMP slurry composition according to claim 1, further comprising: an amphoteric ion compound.

10. The CMP slurry composition according to claim 9, wherein the amphoteric ion compound comprises alanine, phenylalanine, proline, glycine, histidine, lysine, arginine, threonine, aspartic acid, tryptophan, glutamine, betaine, cocamidopropyl betaine, lauryl propyl betaine, or a combination thereof.

11. The CMP slurry composition according to claim 9, comprising the amphoteric ion compound in an amount of about 0.001 wt % to about 1 wt %.

12. The CMP slurry composition according to claim 1, comprising: about 0.01 wt % to about 1 wt % of the metal oxide particles, about 0.001 wt % to 2 wt % of the diisocyanate compound, and the balance of the deionized water.

13. The CMP slurry composition according to claim 1, wherein the CMP slurry composition has a polishing speed of about 2000 Å/minute or more when polishing an oxide layer on a nitride layer, and a selection ratio of about 50 or more, as calculated by Equation 1:

$$\text{Selection ratio} = \beta/\alpha \quad \text{[Equation 1]}$$

wherein $\alpha$ is a polishing speed for a nitride layer and $\beta$ is a polishing speed for an oxide layer on a trench.

14. A polishing method comprising: polishing a semiconductor wafer using the CMP slurry composition according to claim 1.

15. The CMP slurry composition according to claim 7, wherein the metal oxide particles are prepared by calcination, flame oxidation, or thermal synthesis.

16. The CMP slurry composition according to claim 7, wherein the metal oxide particles comprise ceria ($CeO_2$) particles, silica ($SiO_2$) particles, alumina ($Al_2O_3$) particles, titania ($TiO_2$) particles, zirconia ($ZrO_2$) particles, or a combination thereof.

17. The CMP slurry composition according to claim 7, wherein the metal oxide particles have an average particle diameter of about 70 nm to about 150 nm and a specific surface area of about 10 $m^2/g$ to about 50 $m^2/g$.

18. The CMP slurry composition according to claim 7, wherein the metal oxide particles have a positive zeta potential.

19. The CMP slurry composition according to claim 7, wherein the metal oxide particles comprise ceria particles.

20. The CMP slurry composition according to claim 7, wherein the diisocyanate compound has a weight average molecular weight of about 100 g/mol to about 100,000 g/mol.

21. The CMP slurry composition according to claim 7, further comprising: an amphoteric ion compound.

22. The CMP slurry composition according to claim 21, wherein the amphoteric ion compound comprises alanine, phenylalanine, proline, glycine, histidine, lysine, arginine, threonine, aspartic acid, tryptophan, glutamine, betaine, cocamidopropyl betaine, lauryl propyl betaine, or a combination thereof.

23. The CMP slurry composition according to claim 21, comprising the amphoteric ion compound in an amount of about 0.001 wt % to about 1 wt %.

24. The CMP slurry composition according to claim 7, comprising: about 0.01 wt % to about 1 wt % of the metal oxide particles, about 0.001 wt % to 2 wt % of the diisocyanate compound, and the balance of the deionized water.

25. The CMP slurry composition according to claim 7, wherein the CMP slurry composition has a polishing speed of about 2000 Å/minute or more when polishing an oxide layer on a nitride layer, and a selection ratio of about 50 or more, as calculated by Equation 1:

$$\text{Selection ratio} = \beta/\alpha \quad \text{[Equation 1]}$$

wherein $\alpha$ is a polishing speed for a nitride layer and $\beta$ is a polishing speed for an oxide layer on a trench.

26. A polishing method comprising: polishing a semiconductor wafer using the CMP slurry composition according to claim 7.

* * * * *